(12) United States Patent
Kulchycki (10) Patent No.: US 7,978,113 B2
(45) Date of Patent: Jul. 12, 2011

(54) ANALOG-TO-DIGITAL CONVERTER HAVING OUTPUT DATA WITH REDUCED BIT-WIDTH AND RELATED SYSTEM AND METHOD

(75) Inventor: Scott D. Kulchycki, Mountain View, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 12 days.

(21) Appl. No.: 12/584,701

(22) Filed: Sep. 10, 2009

(65) Prior Publication Data

US 2011/0057824 A1 Mar. 10, 2011

(51) Int. Cl.
*H03M 1/12* (2006.01)
(52) U.S. Cl. ........ 341/155; 341/118; 341/120; 341/131; 341/143; 341/144
(58) Field of Classification Search .......... 341/118–121, 341/131, 143, 144, 155
See application file for complete search history.

(56) References Cited

U.S. PATENT DOCUMENTS

| | | | | |
|---|---|---|---|---|
| 5,561,425 | A * | 10/1996 | Therssen | 341/143 |
| 5,748,126 | A * | 5/1998 | Ma et al. | 341/143 |
| 6,005,506 | A * | 12/1999 | Bazarjani et al. | 341/143 |
| 6,215,423 | B1 * | 4/2001 | May et al. | 341/61 |
| 6,326,912 | B1 * | 12/2001 | Fujimori | 341/143 |
| 6,501,406 | B1 * | 12/2002 | Mecchia et al. | 341/143 |
| 6,587,011 | B2 * | 7/2003 | Mellot | 332/117 |
| 6,987,953 | B2 * | 1/2006 | Morris et al. | 455/102 |
| 7,109,906 | B1 * | 9/2006 | Zoso et al. | 341/155 |
| 7,194,036 | B1 * | 3/2007 | Melanson | 375/247 |
| 7,619,551 | B1 * | 11/2009 | Wu | 341/143 |
| 7,809,047 | B2 * | 10/2010 | Kummetz | 375/211 |
| 2002/0018012 | A1 * | 2/2002 | Nakao et al. | 341/143 |
| 2002/0042256 | A1 * | 4/2002 | Baldwin et al. | 455/232.1 |
| 2006/0087466 | A1 * | 4/2006 | Domingo | 341/144 |
| 2007/0252737 | A1 * | 11/2007 | Eikenbroek | 341/143 |
| 2008/0205557 | A1 * | 8/2008 | He | 375/340 |

OTHER PUBLICATIONS

"Dual Channel 11 Bit, 200 MSPS ADC With SNRBoost", Texas Instruments, Apr. 2009, 68 pages.
"Dual Channel 11-Bits, 125 MSPS ADC With Parallel CMOS/DDR LVDS Outputs", Texas Instruments, Jan. 2008, 64 pages.

* cited by examiner

*Primary Examiner* — Linh V Nguyen (57) ABSTRACT

A circuit includes an analog-to-digital converter configured to receive an analog input signal and generate first digital values at a first sampling rate. The first digital values have a first bit-width. The circuit also includes an interpolator configured to receive the first digital values and generate second digital values at a second sampling rate higher than the first sampling rate. The second digital values have a second bit-width equal to or greater than the first bit-width. The circuit further includes a digital filter configured to receive the second digital values and perform bit-width reduction in a recoverable manner to generate third digital values. The third digital values have a third bit-width less than the first and second bit-widths. The circuit could optionally include a recovery circuit configured to process the third digital values to generate recovered digital values at the first sampling rate. The recovered digital values have the first bit-width.

20 Claims, 6 Drawing Sheets

ANALOG-TO-DIGITAL CONVERTER HAVING OUTPUT DATA WITH REDUCED BIT-WIDTH AND RELATED SYSTEM AND METHOD

TECHNICAL FIELD

This disclosure is generally directed to analog-to-digital conversion. More specifically, this disclosure is directed to an analog-to-digital converter having output data with reduced bit-width and related system and method.

BACKGROUND

Analog-to-digital converters (ADCs) are often a fundamental component of wireless base stations and other wireless devices. This is because analog radio frequency or other wireless signals typically must be converted into digital signals to support data processing or transmission. However, data processing and transmission requirements are rapidly evolving, and thus there is an increased need for flexible ADC architectures.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 13, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1:
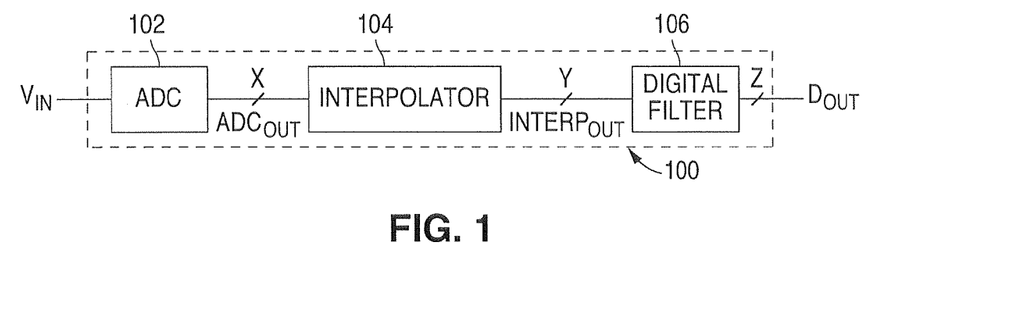
FIG. 1 illustrates an example analog-to-digital converter (ADC) circuit according to this disclosure.

FIG. 1 illustrates an example analog-to-digital converter (ADC) circuit 100 according to this disclosure. As shown in FIG. 1, the ADC circuit 100 includes an ADC 102, an interpolator 104, and a digital filter 106. The ADC 102 receives an analog input signal (in this case, an input voltage $V_{IN}$) and produces corresponding digital values $ADC_{OUT}$. The ADC 102 includes any suitable structure for receiving an analog input signal and generating a corresponding digital output signal. The ADC 102 could, for example, represent a 250 mega-samples per second (MSPS) ADC with 14-bit output values.

The interpolator 104 receives the digital values $ADC_{OUT}$ produced by the ADC 102. The interpolator 104 performs an interpolation function to increase the sampling rate of the digital values. The interpolator 104 may also perform a filtering function, which is described below. The interpolator 104 produces digital values $INTERP_{OUT}$ at the higher sampling rate. The interpolator 104 includes any suitable structure for performing interpolation to increase a sampling rate of digital samples. The interpolator 104 could, for example, represent a 2× interpolator that receives digital values at a rate of 250 MSPS and outputs digital values at a rate of 500 MSPS.

The digital filter 106 receives the digital values $INTERP_{OUT}$ produced by the interpolator 104. The digital filter 106 adds shaped noise in one or more selected portions of the data spectrum (outside of the bandwidth where the digital values $ADC_{OUT}$ are located) and modulates or encodes the digital values. This allows the digital values $INTERP_{OUT}$ to be represented by a fewer number of bits. The digital filter 106 produces digital values $D_{OUT}$, which represent the output of the ADC circuit 100. The digital filter 106 includes any suitable structure for adding shaped noise to a digital signal and modulating the digital signal, such as a digital sigma-delta (ΣΔ) modulator. Note that sigma-delta modulators are also often referred to as delta-sigma (ΔΣ) modulators. The phrase "sigma-delta modulator" encompasses both sigma-delta and delta-sigma modulators.

In this example, the number of bits in the digital values $ADC_{OUT}$ from the ADC 102 is denoted X. The number of bits in the digital values $INTERP_{OUT}$ from the interpolator 104 is denoted Y. The number of bits in the digital values $D_{OUT}$ from the digital filter 106 is denoted Z. As described in more detail below, the interpolator 104 outputs digital values $INTERP_{OUT}$ having at least the same number of bits as the digital values $ADC_{OUT}$ and possibly more (meaning Y≧X). Also, the shaped noise added by the digital filter 106 allows the digital values $INTERP_{OUT}$ to be represented by fewer bits than the digital values $ADC_{OUT}$ (meaning Z<x≦Y). In particular embodiments, the digital values $ADC_{OUT}$ represent 14-bit values, the digital values $INTERP_{OUT}$ represent 15-bit values, and the digital values $D_{OUT}$ represent 9-bit values. However, as described below, the digital values $D_{OUT}$ can be processed to substantially recover the original 14-bit digital values $ADC_{OUT}$.

In this way, the ADC circuit 100 has an output with a reduced bit-width, which refers to the number of bits in each digital value of a digital stream. However, the bit-width reduction performed by the ADC circuit 100 is done in a recoverable manner, meaning the original digital stream can be substantially recovered. Also, fewer output pins are needed in the circuit 100. Further, in particular embodiments, the ADC circuit 100 could be implemented such that a user has access only to the $V_{IN}$ and $D_{OUT}$ pins without having access to the other signals generated internally within the circuit 100.

Although FIG. 1 illustrates an example ADC circuit 100, various changes may be made to FIG. 1. For example, the specific number of mega-samples per second and the specific bit width of each digital signal described above are for illustration only. Signals with different mega-samples per second or bit widths could also be used.

Figure 2:
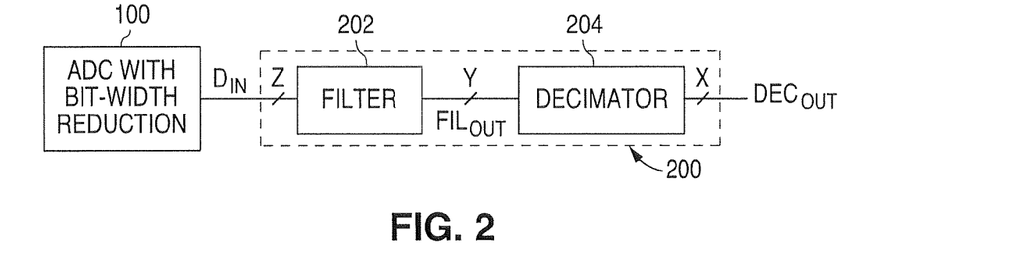
FIG. 2 illustrates an example recovery circuit for use with an ADC circuit according to this disclosure.

FIG. 2 illustrates an example recovery circuit 200 for use with an ADC circuit according to this disclosure. More specifically, the recovery circuit 200 can be used to recover data having a larger bit-width based on digital values received from an ADC circuit implementing output data bit-width reduction (such as the circuit 100 of FIG. 1).

As shown in FIG. 2, the recovery circuit 200 includes a filter 202 and a decimator 204. The filter 202 receives digital values $D_{IN}$, which here may represent the digital values $D_{OUT}$ produced by the ADC circuit 100. The digital values $D_{IN}$ could, for example, represent 9-bit values received at a rate of 500 MSPS. As noted above, the digital filter 106 in the ADC circuit 100 could apply shaped noise to the digital values $INTERP_{OUT}$, and the filter 202 could operate to substantially remove this shaped noise from the digital values $D_{IN}$ to produce filtered digital values $FIL_{OUT}$. The filter 202 includes any suitable structure for filtering digital values. If the shaped noise is added to a higher portion of the data spectrum and the digital values $ADC_{OUT}$ are in a lower portion of the data spectrum, the filter 202 could represent a low-pass filter.

The filtered digital values $FIL_{OUT}$ are provided to the decimator 204, which decimates the digital values $FIL_{OUT}$ to produce recovered digital values $DEC_{OUT}$. For example, the decimator 204 can reduce the sampling rate and possibly reduce the bit-width of the filtered digital values $FIL_{OUT}$. As a particular example, the decimator 204 could receive 15-bit digital values $FIL_{OUT}$ at a rate of 500 MSPS and produce 14-bit digital values $DEC_{OUT}$ at a rate of 250 MSPS. The decimator 204 includes any suitable structure for decimating digital values.

In particular embodiments, the recovery circuit 200 could be implemented using a digital signal processor (DSP), an application-specific integrated circuit (ASIC), or a field programmable gate array (FPGA). Also, in particular embodiments, the specific design parameters for the filter 202 and the decimator 204 may vary depending on the application. For instance, the filtering necessary to recover the digital values $ADC_{OUT}$ from the digital values $D_{IN}$ may be based on the specific design requirements of a base station or other wireless device, as well as where the shaped noise is added to the data spectrum.

Although FIG. 2 illustrates an example recovery circuit 200 for use with an ADC circuit, various changes may be made to FIG. 2. For example, other types of circuits could be used to recover larger bit-width data from the ADC circuit 100.

Figure 3:
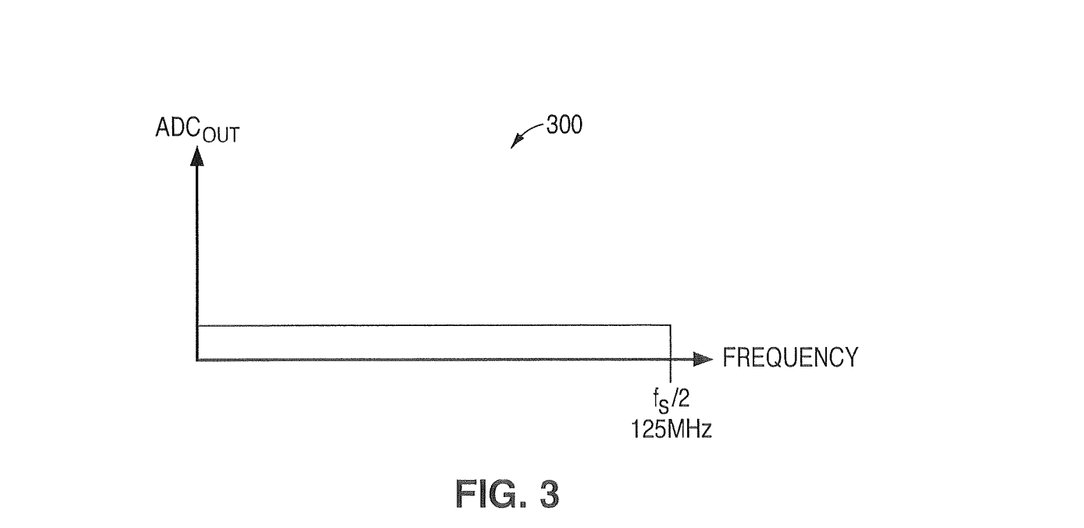
FIGS. 3 through 8 illustrate example output spectra associated with operation of an ADC circuit and a recovery circuit according to this disclosure.

FIGS. 3 through 8 illustrate example output spectra associated with operation of an ADC circuit and a recovery circuit according to this disclosure. FIG. 3 illustrates an example theoretical spectrum 300 of the digital values $ADC_{OUT}$ produced by the ADC 102. The spectrum 300 is that of a typical pipeline ADC where, in the absence of an input signal, the spectrum 300 shows a flat noise floor. The noise floor is determined by the input-referred noise of the ADC 102 between 0Hz and half its input sampling rate (such as 125 MHz for a 250 MSPS ADC).

In particular embodiments, the noise at the output of the ADC 102 integrated from 0 MHz to 125 MHz may yield a 73 dBFS signal-to-noise ratio (SNR) or better assuming a −1 dBFS input. Also, in particular embodiments, the spurious free dynamic range (SFDR) of the ADC 102 may determine any spurs that are generated in the 125 MHz bandwidth as a result of applying an input signal. In particular embodiments, the ADC 102 could offer up to 95 dBFS SFDR performance or better.

Figure 4:
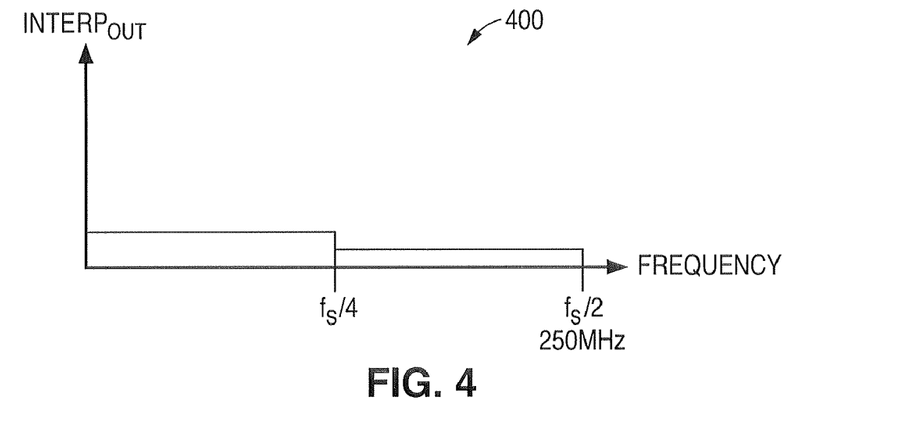

FIG. 4 illustrates an example theoretical spectrum 400 of the digital values $INTERP_{OUT}$ produced by the interpolator 104. The interpolator 104 operates to increase the sampling rate, such as by a factor of two from 250 MSPS to 500 MSPS. The interpolator 104 may also perform low-pass or other filtering of replicated ADC noise, such as noise above 125 MHz. As shown in FIG. 4, the data that was present in the output of the ADC 102 as shown in FIG. 3 may remain substantially unchanged.

In particular embodiments, the filtering may yield a much lower thermal noise floor between 125 MHz and 250 MHz than below 125 MHz. Also, in particular embodiments, while the noise floor from 0 MHz to 125 MHz remains unchanged from FIG. 3, the digital sampling rate $f_s$ has increased to 500 MSPS. Further, in particular embodiments, if the noise is integrated from 0 MHz to 125 MHz, the SNR in that bandwidth may remain equal to 73 dBFS or better for a −1 dBFS input. That is, the data from 0 MHz to 125 MHz has not been affected by the interpolation operation.

Figure 5:
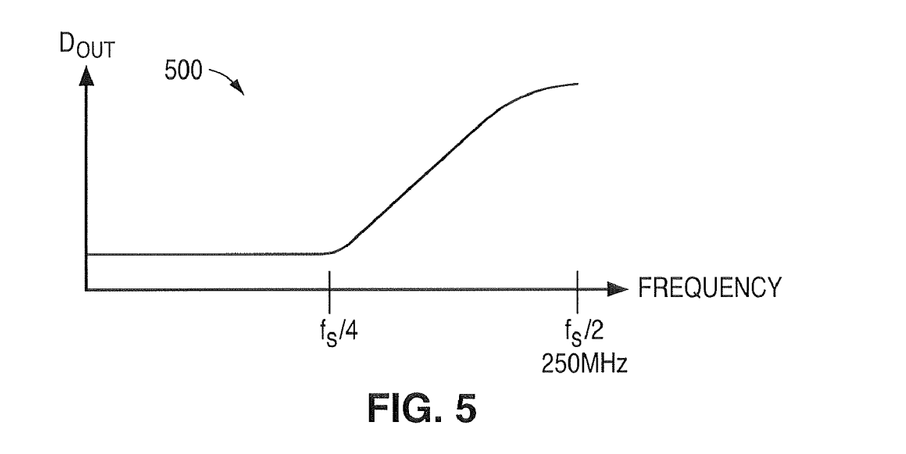

FIG. 5 illustrates an example theoretical spectrum 500 of the digital values $D_{OUT}$ produced by the digital filter 106. In this example, the digital filter 106 adds shaped noise in the higher portion of the spectrum 500, which is done to reduce the number of bits needed to represent the digital data. In general, the maximum achievable SNR of an ADC in the Nyquist bandwidth decreases as the number of bits in the output digital values decreases. Note that the shaped noise could be located in any suitable part(s) of the data spectrum.

In particular embodiments, the digital filter 106 adds shaped noise between 125 MHz and 250 MHz. Also, in particular embodiments, if the noise from 0 MHz to 125 MHz is integrated, the maximum SNR in that bandwidth may be 73 dBFS or better for a −1 dBFS input, and the SFDR in the 125 MHz bandwidth may be limited only by the ADC 102. However, FIG. 5 also shows that enough noise has been added between 125 MHz and 250 MHz so that this digital signal can be represented using reduced-width values, such as 9-bit values. Further, in particular embodiments, sigma-delta modulation can be used to encode high bit-width values into higher-speed but lower bit-width values. In addition, in particular embodiments, most of the quantization noise is located in the upper half of the output spectrum (between 125 MHz and 250 MHz) with an output data rate of 500 MSPS. In particular embodiments, the ADC circuit 100 may therefore output 9-bit, 500 MSPS values with high performance, low noise, and low distortion in the 0 MHz to 125 MHz bandwidth and with increasing noise between 125 MHz and 250 MHz. As a result, the ADC circuit 100 in these particular embodiments offers both a high performance bandwidth section between 0 MHz and 125 MHz and a low performance, high noise bandwidth section between 125 MHz and 250 MHz.

In some embodiments, the recovery circuit 200 or other recovery circuit can be used to recover the high performance bandwidth and to discard the low performance bandwidth of the ADC circuit 100. In particular embodiments, the recovery circuit 200 filters the digital values $D_{IN}$ to remove the noise in the spectrum between 125 MHz and 250 MHz, resulting in 500 MSPS digital values $FIL_{OUT}$. Also, in particular embodiments, the digital values $FIL_{OUT}$ are then decimated, such as by a factor of two, to reduce the digital sampling rate from 500 MSPS to 250 MSPS.

Figure 6:
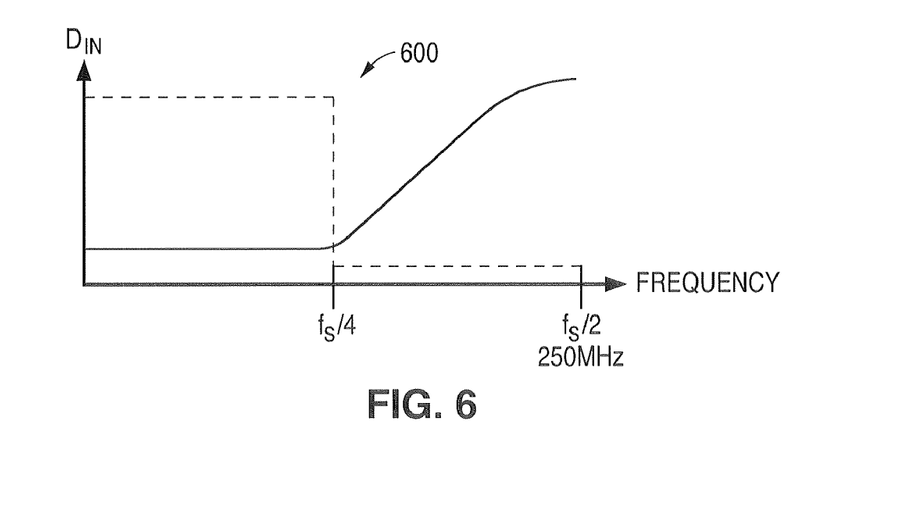

FIG. 6 illustrates an example theoretical spectrum 600 associated with operation of the filter 202, which here is implemented using a low-pass filter. The dashed lines in FIG. 6 represent the ideal operation of the filter 202, which is overlaid on the output spectrum from FIG. 5. Note, however, that the filter 202 could be implemented as any suitable type of filter depending on where the shaped noise is added to the data spectrum.

In particular embodiments, the filter 202 is ideally designed to pass all signals between 0 MHZ and 125 MHz, while attenuating signals above 125 MHz. This ideal filter is shown in FIG. 6 as an ideal brickwall filter, meaning all frequencies above 125 MHz are immediately attenuated. Such an infinitely-sharp filter transition band typically cannot be realized in practice, but some types of filters (such as very high-order filters) can approximate an ideal brickwall filter. Also, in particular embodiments, to suppress very high noise at higher frequencies, the filter 202 can provide significant stopband attenuation, which again may be provided using a high-order filter. Assuming that a very sharp transition band and high stopband attenuation filter 202 is used, the output of the filter 202 in these particular embodiments may represent a 500 MSPS digital signal with a bit-width equal to or greater than 14 bits, such as 15 bits.

Figure 7:
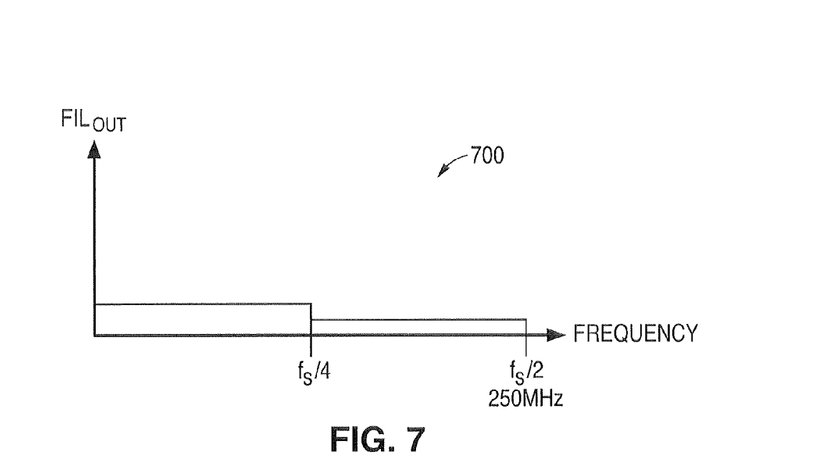

FIG. 7 illustrates an example theoretical spectrum 700 of the digital values $FIL_{OUT}$ produced by this type of filter 202. In particular embodiments, the filter 202 removes almost all of the noise between 125 MHz and 250 MHz without significantly affecting the signal between 0 MHz and 125 MHz. Also, in particular embodiments, the spectrum 700 between 125 MHz and 250 MHz may not be zero. Ideally, the theoretical spectrum 700 matches or very closely approximates the theoretical spectrum 400 of FIG. 4.

Figure 8:
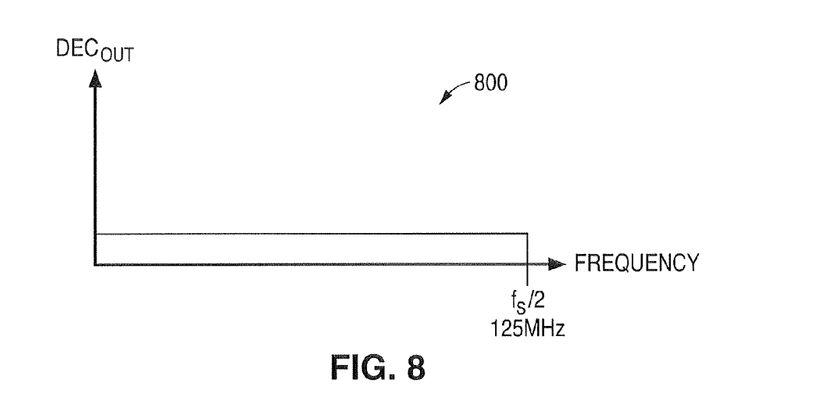

FIG. 8 illustrates an example theoretical spectrum 800 of the digital values $DEC_{OUT}$ produced by the decimator 204. The decimator 204 operates to decimate the output of the filter 202, such as from 500 MSPS to 250 MSPS. This decimation process folds signals from higher portions of the data spectrum into lower portions of the data spectrum, such as from 125 MHz to 250 MHz down into the 0 MHz to 125 MHz bandwidth. Again, this may necessitate the use of high stopband attenuation in the filter 202. The output spectrum 800 of the decimator 204 represents the output of the example recovery circuit 200.

In particular embodiments, because the noise above 125 MHz shown in FIG. 7 folds down below 125 MHz after decimation, the integrated noise from 0 MHz to 125 MHz in FIG. 8 may yield an SNR that is only a few tenths of a decibel less than 73 dBFS or better. However, in particular embodiments, the SFDR performance may not be affected, and the 125 MHz bandwidth in FIG. 8 may meet or exceed all current and various future wireless infrastructure specifications. Of course, other bandwidths could be used.

Although FIGS. 3 through 8 illustrate example output spectra associated with operation of an ADC circuit and a recovery circuit, various changes may be made to FIGS. 3 through 8. For example, the spectra shown in FIGS. 3 through 8 are for illustration only, and other spectra could be supported. Also, specific values given above (such as MHz values, bandwidth ranges, bit-width values, performance specification values, and MSPS values) are for illustration only, and other values could be used.

Figure 9:
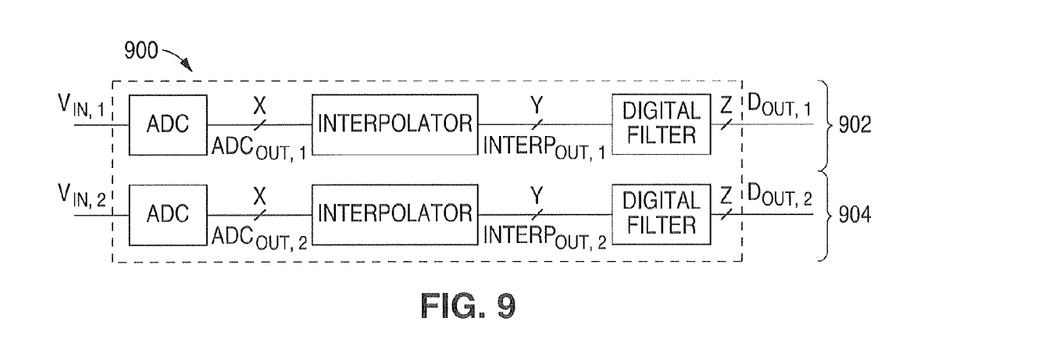
FIGS. 9 and 10 illustrate example multi-channel ADC circuits according to this disclosure.
Figure 10:
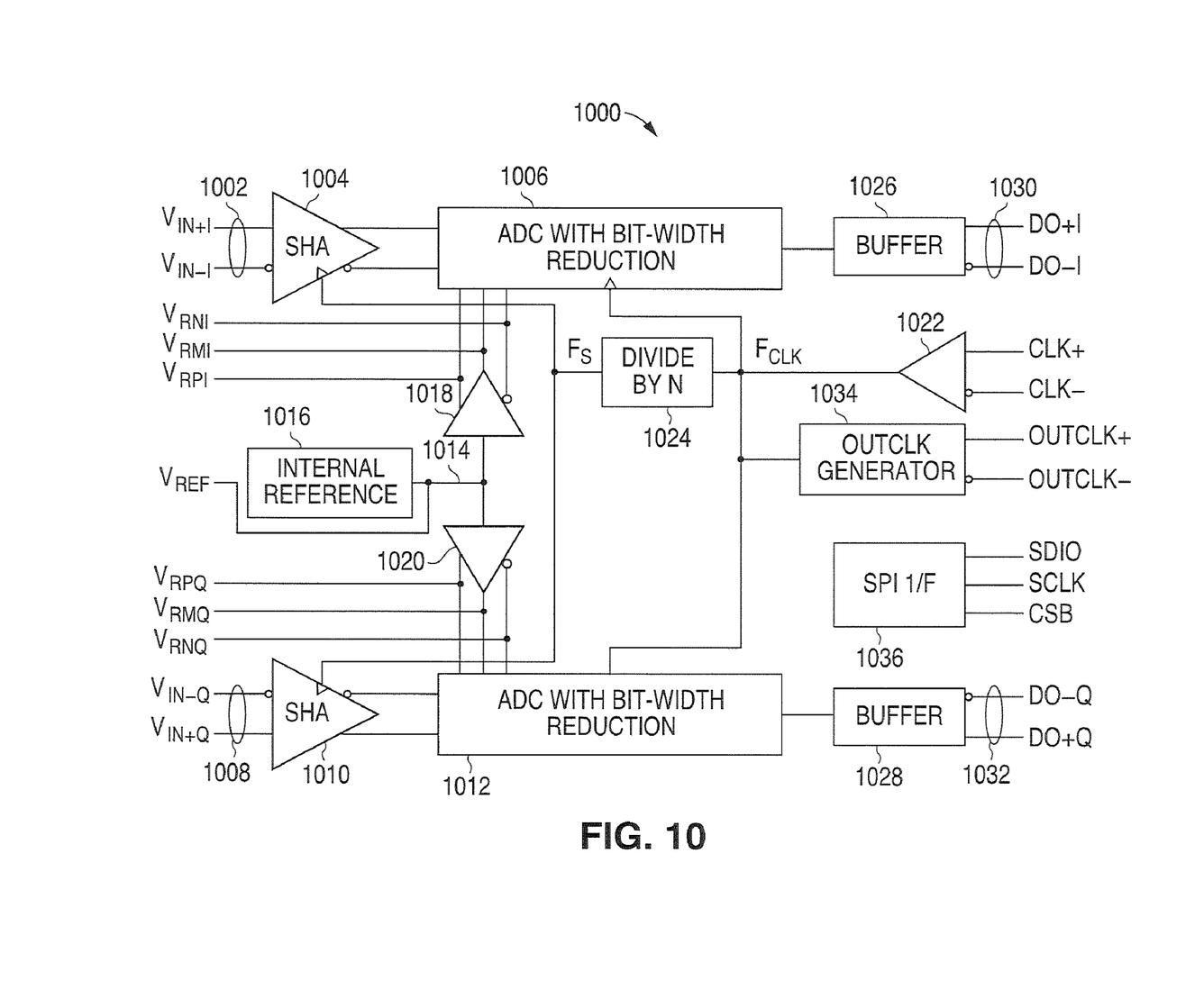

FIGS. 9 and 10 illustrate example multi-channel ADC circuits 900 and 1000 according to this disclosure. As shown in FIG. 9, the multi-channel ADC circuit 900 includes two separate channels 902-904. Each of the channels 902-904 may represent one instance of the ADC circuit 100 shown in FIG. 1 and described above. The use of two separate channels 902-904 may make the ADC circuit 900 particularly useful in the receive path of a base station or other wireless device. For example, the channel 902 could be used to process in-phase (I) signals, and the channel 904 could be used to process quadrature (Q) signals. In particular embodiments, the ADC circuit 900 could be implemented such that a user has access only to the two $V_{IN}$ pins and the two $D_{OUT}$ pins without having access to the other signals generated internally within the circuit 900.

As shown in FIG. 10, a multi-channel ADC circuit 1000 receives a first set of differential input signals 1002. These input signals 1002 are sampled by a sample and hold amplifier (SHA) 1004, which includes any suitable structure for sampling, holding, and amplifying a signal. An output of the amplifier 1004 is coupled to an ADC with output data bit-width reduction 1006, which could be implemented using the circuit 100 shown in FIG. 1. In a similar manner, a second set of differential input signals 1008 is sampled using a sample and hold amplifier 1010, which has an output coupled to an ADC with output data bit-width reduction 1012.

A reference voltage 1014 can be generated internally by an internal reference source 1016, which includes any suitable structure for generating a reference voltage (such as a 1.2V bandgap stabilized voltage source). The reference voltage 1014 could also be received from an external source, such as from an external 1.2V source, which can improve channel gain matching in a system employing multiple circuits 1000. In this example, the analog circuitry may operate from a 3.0V supply, while the 1.8V digital core can be independently supplied. Also, common mode voltages $V_{RMI}$ and $V_{RMQ}$, positive reference voltages $V_{RPI}$ and $V_{RPQ}$, and negative reference voltages $V_{RNI}$ and $V_{RNQ}$ could be generated by internal amplifiers 1018-1020, which may include any suitable structures for performing amplification. External bypass capacitors may be used with these reference voltages in order to ensure specified converter performance.

In this example, a single-ended or differential clock signal CLK± is received at a buffer 1022, which includes any suitable structure for buffering a signal. A single-ended clock could be used by grounding the CLK– pin. The frequency $F_{CLK}$ of the clock signal is divided by a divide-by-N circuit 1024, which includes any suitable structure for dividing the frequency of a signal (such as a divide-by-2 or divide-by-4 circuit). The divide-by-N circuit 1024 produces a signal with a slower frequency $F_s$, which is used to clock the sample and hold amplifiers 1004 and 1010. The buffered clock signal in this example is used to clock the ADCs 1006 and 1012, although a divide-by-M circuit could be used to divide the clock signal prior to clocking the ADCs 1006 and 1012.

Output signals from the ADCs 1006 and 1012 are provided to two buffers 1026-1028, which provide differential output signals 1030-1032, respectively. Each of the buffers 1026-1028 includes any suitable structure for buffering a signal, such as a double data rate (DDR) low voltage differential signaling (LVDS) buffer. Each of the output signals 1030-1032 could represent differential signals having an output common mode voltage set externally by connecting an LVDS bias pin with a resistor (such as 4 kΩ) to ground. The LVDS format could define output data having a sequence of D0/1±, D0/2±, . . . , D8/OVR±, where the OVR value identifies an over-range detection at the corresponding ADC's input. The even bits of output data can be captured at the positive edge of an output clock signal OUTCLK± produced by an output clock generator 1034, which includes any suitable structure for outputting a clock signal. The odd bits of output data can be captured at the negative edge of an output clock signal OUTCLK± produced by the output clock generator 1034. In addition, a serial peripheral interface (SPI) 1036 can be used to facilitate control interaction with the circuit 1000. The interface 1036 is coupled to a serial data input/output (SDIO) pin, a serial clock (SCLK) pin, and a chip select bar (CSB) pin.

In particular embodiments, the circuit 1000 may have the following characteristics. The circuit 1000 can be implemented as a dual-input, low-power, high-performance CMOS ADC with a 1.4 GHz full-power bandwidth that samples its inputs 1002-1004 at 250 MSPS and outputs 9-bit digital values at output rates up to 500 MSPS. The circuit 1000 can use on-chip sample-and-hold circuitry to minimize power consumption while providing excellent dynamic performance. The DDR digital outputs 1030-1032 can be provided on differential LVDS signal pairs with an output common mode voltage of 700 mV and ±300 mV output swing. The circuit 1000 can operate on dual +3.0V and +1.8V supplies with a power-down feature to reduce the power consumption to very low levels while enabling fast recovery to full operation. The circuit 1000 can be packaged in a 68-pin LLP package (10 mm×10 mm×1.0 mm with 0.5 mm pin-pitch) that does not require a heat sink over a rated temperature range of −40° C. to +85° C. The circuit 1000 can achieve a 73 dBFS SNR and 95 dBFS SFDR or better over its 125 MHz bandwidth. The circuit 1000 can provide an internal precision 1.2V reference, support single-ended or differential clock modes, operate using a single 500 MHz input clock, and have a low power consumption of 2 W.

Although FIGS. 9 and 10 illustrate example multi-channel ADC circuits 900 and 1000, various changes may be made to FIGS. 9 and 10. For example, the ADC circuits 900 and 1000 could include more than or less than two channels. Also, specific values given above (such as MHz values, bandwidth ranges, bit-width values, performance specification values, and MSPS values) are for illustration only, and other values could be used.

Figure 11:
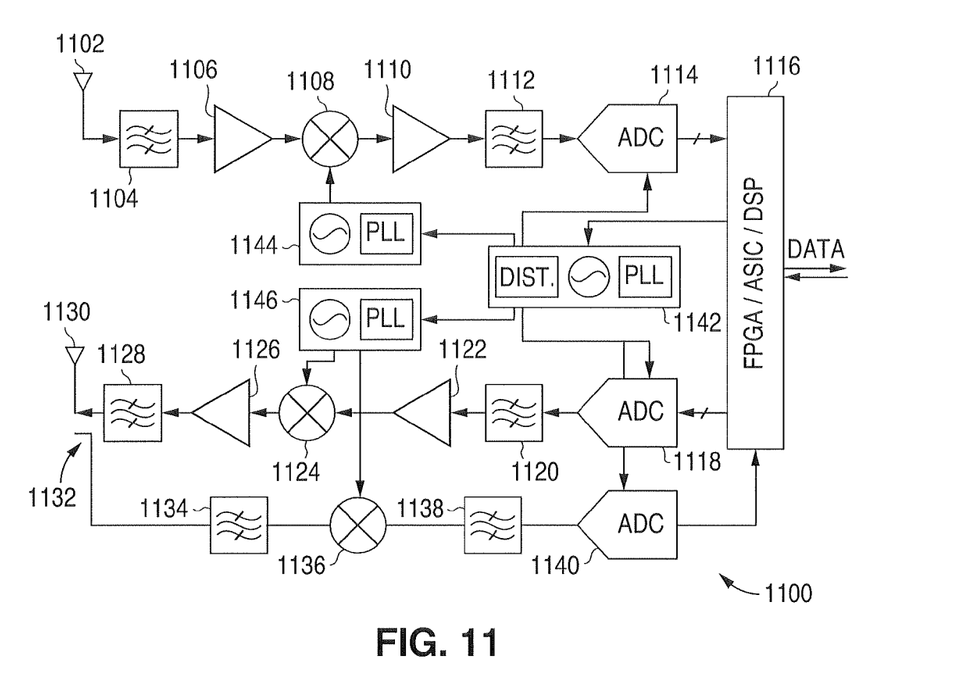
FIGS. 11 and 12 illustrate example devices incorporating at least one ADC circuit according to this disclosure.
Figure 12:
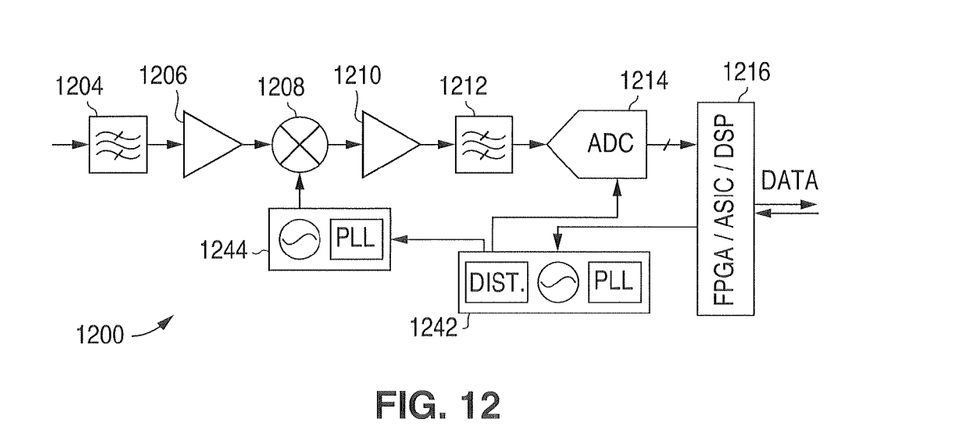

FIGS. 11 and 12 illustrate example devices 1100 and 1200 incorporating at least one ADC circuit according to this disclosure. In FIG. 11, a device 1100 may represent a wireless base station, a wireless repeater, or other wireless device in a communication network. The device 1100 includes a receive path having an antenna 1102 that receives wireless signals, a filter 1104 that filters the received wireless signals, and an amplifier 1106 that amplifies the filtered signals. A mixer 1108 mixes the amplified signals with lower-frequency signals to down-convert the amplified signals, and an amplifier 1110 amplifies the down-converted signals. A filter 1112 filters the amplified down-converted signals, and an ADC 1114 converts the filtered signals into digital values for a processing device 1116 (such as a DSP, FPGA, or ASIC).

The device 1100 also includes a transmit path having a digital-to-analog converter (DAC) 1118 that receives digital values and produces corresponding analog signals. The analog signals are filtered by a filter 1120, amplified by an amplifier 1122, and up-converted by a mixer 1124. The up-converted signals are amplified by a power amplifier 1126, filtered by a filter 1128, and transmitted from an antenna 1130.

A feedback path is used in conjunction with the transmit path. The feedback path includes a directional coupler 1132 that couples part of the transmitted power, such as a fixed portion (like around 10%), to a filter 1134 that filters the signals from the coupler 1132. The filtered signals are down-converted by a mixer 1136, filtered by a filter 1138, and digitized by an ADC 1140.

Clock signals used by various components in the device 1100 are generated using a clock source 1142, which in this example includes a voltage-controlled oscillator (VCO), a phase-locked loop (PLL) that controls the VCO, and a distributor for providing a clock signal from the VCO. The clock signal from the clock source 1142 is used to clock converters 1114, 1118, and 1140. The clock signal from the clock source 1142 is provided to a clock source 1144, which includes another voltage-controlled oscillator and phase-locked loop. The clock source 1144 generates a clock signal used by the mixer 1106. The clock signal from the clock source 1142 is further provided to a clock source 1146, which includes yet another voltage-controlled oscillator and phase-locked loop. The clock source 1146 generates clock signals used by the mixers 1124 and 1136.

In FIG. 12, a device 1200 may represent a set-top box in an audio/video/data distribution network, a spectrum or network analyzer, or other device receiving data over a network. In this example, the device 1200 includes a receive path having a filter 1204, an amplifier 1206, a mixer 1208, an amplifier 1210, a filter 1212, and an ADC 1214. The receive path may therefore be similar to the receive path shown in FIG. 11 and described above. A processing device 1216 uses digital data values from the ADC 1214, such as to display an audio/video program, to process data, or to analyze a spectrum or a network. A clock source 1242 and a clock source 1244 are used to clock various components in the receive path of the device 1200.

In the example embodiment shown in FIG. 11, the ADCs 1114 and 1140 could include any of the ADC circuits shown in FIGS. 1, 9, and 10. Similarly, in the example embodiment shown in FIG. 12, the ADC 1214 could include any of the ADC circuits shown in FIGS. 1, 9, and 10.

Although FIGS. 11 and 12 illustrate example devices 1100 and 1200 incorporating at least one ADC circuit, various changes may be made to FIGS. 11 and 12. For example, these represent only two examples of how the ADC circuits shown in FIGS. 1, 9, and 10 could be used. The ADC circuits could be used in any other or additional devices or systems, regardless of whether the bit-width reduced output data is processed to recover higher bit-width data. Also, base stations, wireless repeaters, set-top boxes, and network or spectrum analyzers could have any other, additional, or fewer components arranged in any other suitable manner, along with at least one ADC supporting output data bit-width reduction.

Figure 13:
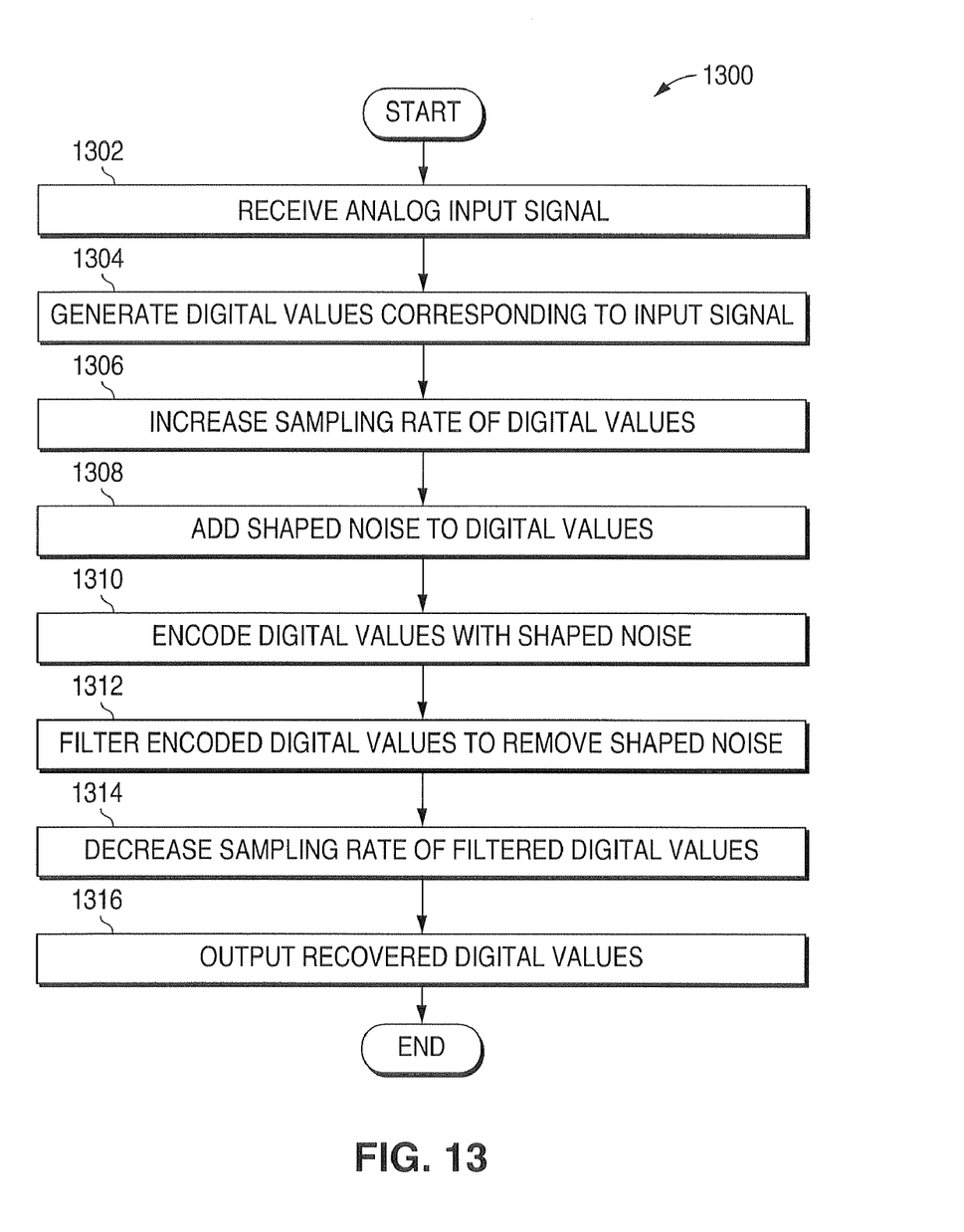
FIG. 13 illustrates an example method for analog-to-digital conversion using output data with reduced bit-width and data recovery according to this disclosure.

FIG. 13 illustrates an example method 1300 for analog-to-digital conversion using output data with reduced bit-width and data recovery according to this disclosure. For ease of explanation, the method 1300 is described with respect to the ADC circuit 100 of FIG. 1 and the recovery circuit 200 of FIG. 2. The same or similar method could be used by any other ADC circuit (such as circuits 900 and 1000) and by any other recovery circuit (or the recovery circuit can be omitted).

As shown in FIG. 13, an analog input signal is received at step 1302. This could include, for example, the ADC circuit 100 receiving an input voltage $V_{IN}$. Digital values corresponding to the input signal are generated at step 1304. This could include, for example, the ADC 102 generating digital values $ADC_{OUT}$ based on the received input voltage $V_{IN}$.

A sampling rate of the digital values is increased at step 1306. This could include, for example, the interpolator 104 performing interpolation operations to increase the sampling rate of the digital values $ADC_{OUT}$. This may or may not involve increasing the number of bits in the digital values $INTERP_{OUT}$ compared to the number of bits in the digital values $ADC_{OUT}$. Shaped noise is added to the digital values at step 1308. This could include, for example, the digital filter 106 adding shaped noise above a certain threshold (such as 125 MHz) or in other portion(s) of the data spectrum. The digital values with the shaped noise are encoded at step 1310. This could include, for example, the digital filter 106 (such as a sigma-delta modulator) modulating the digital values $INTERP_{OUT}$ to decrease the number of bits required in the digital values $D_{OUT}$. As a result, the digital values $D_{OUT}$ have a smaller number of bits than the digital values $ADC_{OUT}$ from the ADC 102, achieving bit-width reduction in the circuit 100.

At this point, the digital values $D_{OUT}$ could be used in any suitable manner. Recovery of the higher bit-width data values may or may not be required. If recovery of the higher bit-width data values is desired, the encoded digital values are filtered to remove the shaped noise at step 1312, and the sampling rate of the filtered digital values is decreased at step 1314. This could include, for example, filtering the digital values $D_{OUT}$ (called $D_{IN}$ in FIG. 2) using a filter 202 and decimating the filtered values using a decimator 204. This produces recovered digital values that are output at step 1316.

Ideally, the recovered digital values represent the same digital values $ADC_{OUT}$ output by the ADC 102.

Although FIG. 13 illustrates an example method 1300 for analog-to-digital conversion using output data with reduced bit-width and data recovery, various changes may be made to FIG. 13. For example, recovery of the higher bit-width data values may not be needed, and steps 1312-1316 could be omitted. Also, other recovery techniques could be used.

It may be advantageous to set forth definitions of certain words and phrases that have been used within this patent document. The phrase "wireless device" refers to any device that can transmit and/or receive data wirelessly, even if the "wireless device" has the ability to transmit and/or receive data over a wired connection as well. The term "couple" and its derivatives refer to any direct or indirect communication between two or more components, whether or not those components are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like.

While this disclosure has described certain embodiments and generally associated methods, alterations and permutations of these embodiments and methods will be apparent to those skilled in the art. Accordingly, the above description of example embodiments does not define or constrain this invention. Other changes, substitutions, and alterations are also possible without departing from the spirit and scope of this invention as defined by the following claims.

What is claimed is:

1. A circuit comprising:
an analog-to-digital converter configured to receive an analog input signal and generate first digital values at a first sampling rate, the first digital values having a first bit-width, the analog-to-digital digital converter having a noise floor that is substantially flat specified spectrum;
an interpolator configured to receive the first digital values and to generate second digital values at a second sampling rate higher than the first sampling rate, the second digital values having a second bit-width equal to or greater than the first bit-width, the interpolator having a noise floor that is substantially flat in a first portion of the specified spectrum and that is substantially flat in a second portion of the specified spectrum; and
a digital filter configured to receive the second digital values and to perform bit-width reduction in a recoverable manner to generate third digital values, the third digital values having a third bit-width less than the first and second bit-widths, the digital filter having a noise floor that is substantially flat in the first portion of the specified spectrum and that rises in the second portion of the specified spectrum.

2. The circuit of claim 1, wherein the digital filter is configured to perform the bit-width reduction by:
adding shaped noise to the second portion of the specified spectrum; and
encoding the second digital values with the shaped noise to generate the third digital values.

3. The circuit of claim 2, wherein the digital filter comprises a digital sigma-delta modulator.

4. The circuit of claim 2, further comprising:
a recovery circuit configured to process the third digital values to generate recovered digital values at the first sampling rate, the recovered digital values having the first bit-width.

5. The circuit of claim 4, wherein the recovery circuit comprises:
a filter configured to filter the third digital values and to output fourth digital values at the second sampling rate, the fourth digital values having the second bit-width; and
a decimator configured to receive the fourth digital values and to generate the recovered digital values at the first sampling rate.

6. The circuit of claim 1, wherein the circuit is packaged such that the first digital values and the second digital values are not accessible to external circuitry.

7. The circuit of claim 1, wherein:
the analog-to-digital converter is configured to generate 14-bit first digital values at up to 250 mega-samples per second;
the interpolator is configured to generate 15-bit second digital values at up to 500 mega-samples per second; and
the digital filter is configured to generate 9-bit third digital values at up to 500 mega-samples per second.

8. The circuit of claim 1, wherein:
the analog-to-digital converter, the interpolator, and the digital filter comprise a first channel configured to process a first analog input signal; and
the circuit further comprises a second channel including a second analog-to-digital converter, a second interpolator, and a second digital filter, the second channel configured to process a second analog input signal.

9. A system comprising:
a signal path configured to receive and process incoming signals, the signal path comprising:
an analog-to-digital converter configured to receive an analog input signal and generate first digital values at a first sampling rate, the first digital values having a first bit-width, the analog-to-digital having noise floor that is substantially flat in a specified spectrum;
an interpolator configured to receive the first digital values and to generate second digital values at a second sampling rate higher than the first sampling rate, the second digital values having a second bit-width equal to or greater than the first bit-width, the interpolator having a noise floor that is substantially flat in a first portion of the specified spectrum and that is substantially flat in a second portion of the spectrum; and
a digital filter configured to receive the second digital values and to perform bit-width reduction in a recoverable manner on the second digital values to generate third digital values, the third digital values having a third bit-width less than the first and second bit-widths, the digital filter having a noise floor that is substantially flat in the first portion of the specified spectrum and that rises in the second portion of the specified spectrum.

10. The system of claim 9, wherein the digital filter is configured to perform the bit-width reduction by:
adding shaped noise to the second portion of the specified spectrum; and
encoding the second digital values with the shaped noise to generate the third digital values.

11. The system of claim 9, further comprising:
a recovery circuit configured to process the third digital values to generate recovered digital values having a larger bit-width than the third digital values.

12. The system of claim 11, wherein the recovery circuit comprises:
a filter configured to filter the third digital values and to output a recovered digital signal having a bit-width larger than the bit-width of the third digital values; and
a decimator configured to receive the recovered digital signal and to generate the recovered digital values at a sampling rate lower than a sampling rate of the third digital values, the recovered digital values having a bit-width larger than the bit-width of the third digital values.

13. The system of claim 9, wherein the signal path further comprises:
a first filter configured to filter the incoming signals;
a first amplifier configured to amplify the filtered signals;
a mixer configured to down-convert the amplified signals;
a second amplifier configured to amplify the down-converted signals; and
a second filter configured to filter the amplified down-converted signals;
wherein an output of the second filter is coupled to an input of the analog-to-digital converter.

14. The system of claim 9, wherein the signal path further comprises:
a first filter configured to filter the incoming signals;
a mixer configured to down-convert the filtered signals; and
a second filter configured to filter the down-converted signals;
wherein an output of the second filter is coupled to an input of the analog-to-digital converter.

15. The system of claim 9, wherein the signal path comprises a receive path of a base station, the base station further comprising:
a transmit path configured to transmit wireless signals; and
a feedback path associated with the transmit path.

16. The system of claim 9, wherein the signal path comprises a receive path of a wireless repeater, the wireless repeater further comprising:
a transmit path configured to transmit wireless signals; and
a feedback path associated with the transmit path.

17. The system of claim 9, wherein the signal path comprises a receive path of a set-top box, the set-top box further comprising:
a processing device configured to process the third digital values.

18. The system of claim 9, wherein the signal path comprises a receive path of a spectrum or network analyzer, the analyzer further comprising:
a processing device configured to process the third digital values in order to perform spectral or network analysis.

19. A method comprising:
receiving an analog input signal;
generating first digital values at a first sampling rate using an analog-to-digital converter, the first digital values having a first bit-width, the analog-to-digital converter having a noise floor that is substantially flat in a specified spectrum;
increasing a sampling rate of the first digital values to generate second digital values using an interpolator, the second digital values having a second bit-width equal to or greater than the first bit-width, the interpolator having a noise floor that is substantially flat in a first portion of the specified spectrum and that is substantially flat in a second portion of the specified spectrum; and
performing bit-width reduction in a recoverable manner on the second digital values to generate third digital values using a digital filter, the third digital values having a third bit-width less than the first and second bit-widths, the digital filter having a noise floor that is substantially flat in the first portion of the specified spectrum and that rises in the second portion of the specified spectrum.

20. The method of claim 19, further comprising:
filtering the third digital values to generate fourth digital values at the second sampling rate using a filter, the fourth digital values having the second bit-width, the filter having a noise floor substantially identical to the noise floor of the interpolator; and
decimating the fourth digital values to generate recovered digital values at the first sampling rate using a decimator, the decimator having a noise floor substantially identical to the noise floor of the analog-to-digital converter.

* * * * *